(12) United States Patent
Schoormans et al.

(10) Patent No.: US 7,557,903 B2
(45) Date of Patent: Jul. 7, 2009

(54) LITHOGRAPHIC APPARATUS AND DEVICE MANUFACTURING METHOD

(75) Inventors: Carolus Johannes Catharina Schoormans, Hoge-Mierde (NL); Emiel Jozef Melanie Eussen, Eindhoven (NL); Willem Herman Gertruda Anna Koenen, Roermond (NL); Nicolas Alban Lallemant, Veldhoven (NL); Engelbertus Antonius Fransiscus Van Der Pasch, Oirschot (NL); Johannes Mathias Theodorus Antonius Adriaens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 521 days.

(21) Appl. No.: 11/296,871

(22) Filed: Dec. 8, 2005

(65) Prior Publication Data
US 2007/0132980 A1 Jun. 14, 2007

(51) Int. Cl.
*G03B 27/58* (2006.01)
*G03B 27/42* (2006.01)

(52) U.S. Cl. .......................................... 355/72; 355/53
(58) Field of Classification Search .................. 355/52, 355/53, 55, 67, 72, 75; 356/399–401; 250/548
See application file for complete search history.

(56) References Cited

U.S. PATENT DOCUMENTS 5,767,523 A * 6/1998 McCullough ............... 250/548
7,292,312 B2 * 11/2007 Loopstra et al. ............... 355/53

* cited by examiner

*Primary Examiner*—Hung Henry Nguyen
(74) *Attorney, Agent, or Firm*—Sterne, Kessler, Goldstein & Fox P.L.L.C.

(57) ABSTRACT

A device manufacturing method includes projecting a patterned beam of radiation onto a substrate, wherein the position of a movable object is determined in a number of degrees of freedom using a number of sensors, the number of sensors being larger than the number of degrees of freedom, wherein the position of the movable object in the number of degrees of freedom is determined using signals of each of the sensors, wherein the signals of the sensors are weighed on the basis of the difference between noise levels of each of the sensors. Accuracy of the position measurement of movable object and/or overlay and focus performance are improved in lithographic apparatus.

8 Claims, 6 Drawing Sheets

LITHOGRAPHIC APPARATUS AND DEVICE MANUFACTURING METHOD

BACKGROUND

1. Field of the Invention

The present invention relates to a method for manufacturing a device and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus comprises a position measurement system for measuring the position of the substrate table in a certain number of degrees of freedom. Such position measurement system comprises a set of sensors, the number of sensors being at least equal to the number of degrees of freedom that is measured with the position measurement system. Typically the position of the substrate table is measured in six degrees of freedom (X,Y,Z, Rz, Ry, Rx). For instance, in the known lithographic apparatus an interferometer system with at least six sensors is used to measure the position of the substrate table. However, other configurations to measure the position of movable objects such as substrate tables and patterning device supports are known.

Since the requirements on product quality as well as resolution are continuously increasing, there is a demand for higher accuracy of the image projected on the substrate as well as reproducibility thereof (focus and overlay). In order to obtain such higher accuracy, it is desirable to measure the position of movable objects such as a patterning device support or a substrate table with high accuracy.

SUMMARY

It is desirable to provide a lithographic apparatus having improved overlay and focus and/or having a position measurement system configured to measure the position of a movable object with higher accuracy than the position measuring system of the known lithographic apparatus.

According to an embodiment of the invention, there is provided a device manufacturing method including projecting a patterned beam of radiation onto a substrate, wherein the position of a movable object is determined in a number of degrees of freedom using a number of sensors, the number of sensors being larger than the number of degrees of freedom, wherein the position of the movable object in the number of degrees of freedom is determined using signals of each of the sensors, wherein the signals of the sensors are weighed on the basis of the difference between noise levels of each of the sensors.

According to an embodiment of the invention there is provided a lithographic apparatus including an illumination system configured to condition a radiation beam, a patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the lithographic apparatus includes a position measuring system configured to measure the position of a movable object in a number of degrees of freedom, the position measuring system including a number of sensors, the number of sensors being larger than the number of degrees of freedom, wherein the lithographic apparatus includes a calculation device configured to calculate the position of the movable object in the number of degrees of freedom on the basis of signals of each of the sensors, wherein the calculation device weighs the signals of the sensors on the basis of the difference between noise levels of each of the sensors.

According to an embodiment of the invention, there is provided a device manufacturing method including projecting a patterned beam of radiation onto a substrate, wherein the method includes a calibration step, the calibration step including projecting a patterning device layout having two or more marks on a surface of a substrate and reading the projection of the patterning device layout, wherein the projection of the patterning device layout is repeated to subsequently cover the whole surface of the substrate, wherein the projection may fall partly outside the surface of the substrate in order to enlarge the calibrated area.

According to an embodiment of the invention, there is provided a lithographic apparatus including an illumination system configured to condition a radiation beam, a patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the lithographic apparatus includes a first position measurement system configured to measure the position of the substrate table in a measuring area, and a second position measurement system configured to measure the position of the substrate table in an expose area, the expose and measure area being adjacent to each other in a first direction, the first position measurement system comprising a first sensor and the second position measurement system comprising a second sensor, the first and the second sensor each being configured to measure the position of a substrate table in a second direction perpendicular to the first direction, the first and second sensor being positioned in the second direction on opposed sides of the area in which the substrate table is movable.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
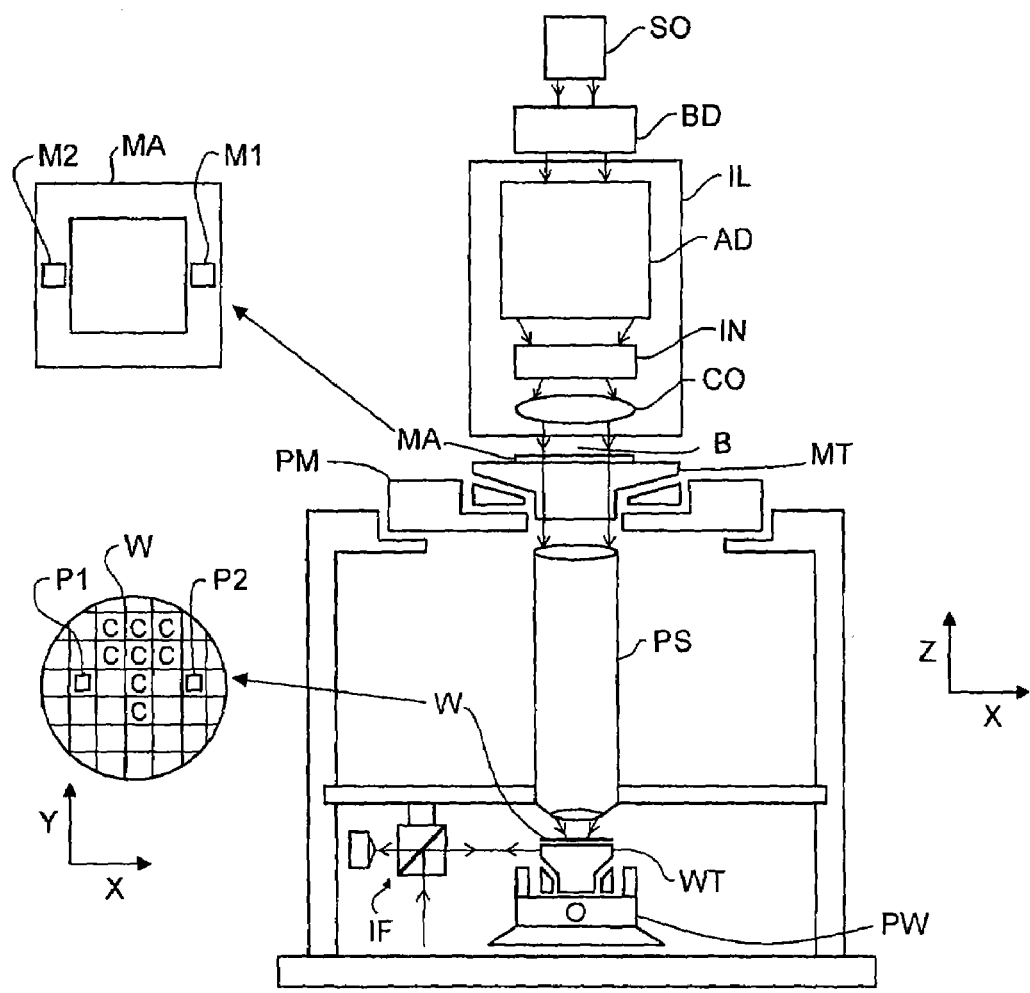
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the known lithographic apparatus different position measurement systems are used to determine the position of a movable object. For instance, an interferometer system including eight sensors is used to determine the position of the substrate table in six degrees of freedom, a position measurement system including four capacitive sensors for measuring three coplanar degrees of freedom of the patterning device support, and a 9 spots level sensor is used for measuring the z-position and rotation about the y-axis of the substrate surface.

In these position measurement systems, the number of sensors is thus higher than the number of degrees of freedom in which the position of the substrate table is measured. In the present application such system is referred to as a redundant position measurement system.

Figure 2:
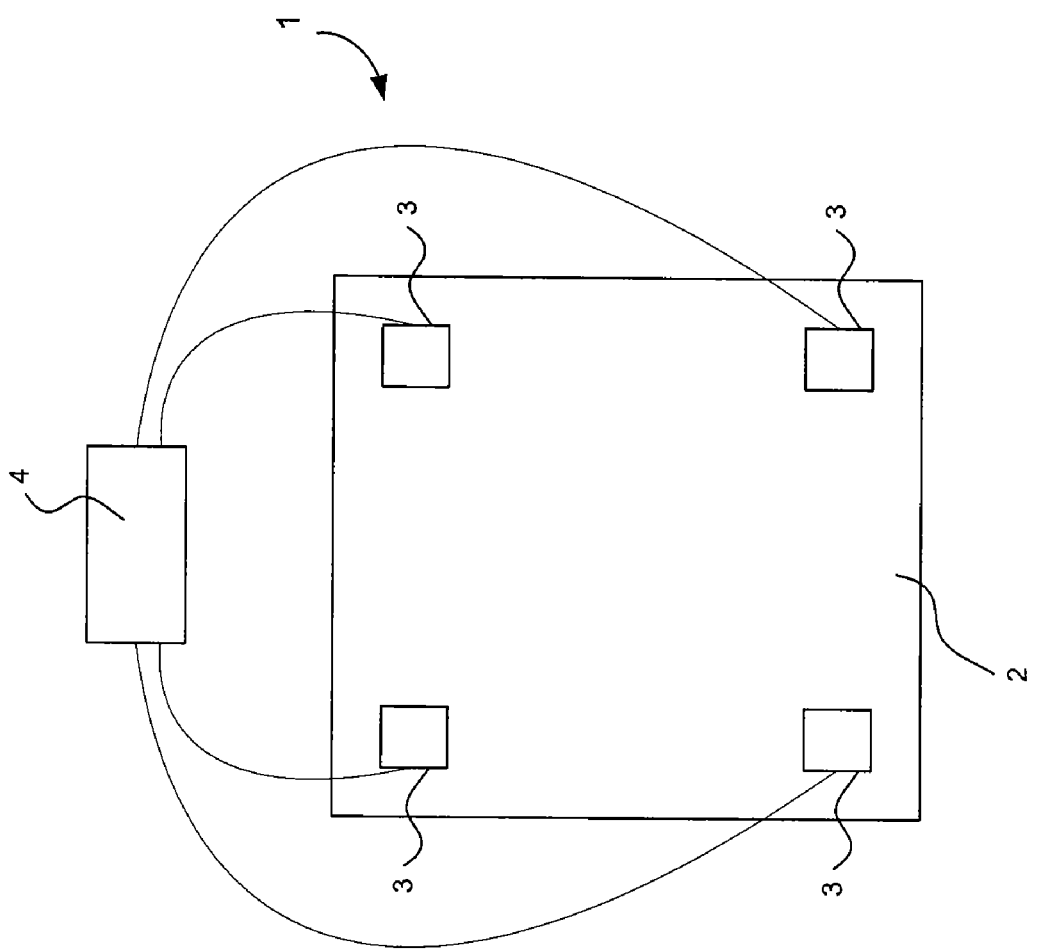
FIG. 2 depicts a position measurement system according to an embodiment of the invention.

FIG. 2 shows an example of a redundant position measurement system overall designated with the reference sign 1. The position measurement system is configured to measure the position of a patterning device 2 in three coplanar degrees of freedom z, Rx and Ry, whereby the z-direction is perpendicular to the plane of the drawing.

The position measurement system includes four capacitive sensors 3 each being connected with a calculation device 4. The capacitive sensors 3 are arranged above the patterning device 2 and are each configured to provide a signal which is representative of the (change in) distance between the patterning device and the respective capacitive sensor 3, and thus the z-position of the patterning device 2. In principle, it is possible to calculate the position of the patterning device in the three coplanar degrees of freedom with three of the four capacitive sensors 3. Thus, one of the capacitive sensors 3 may be regarded as a redundant sensor. The respective signal of each of the capacitive sensors 3 is led to the calculation device 4 where the actual position of the patterning device 2 may be calculated.

According to a first embodiment of the invention, the signals of each of the sensors of a position measurement system may be used to calculate the actual position of a movable object. The benefit of such calculation will be explained hereinafter. The function which describes how the values s of sensors of the position measurement system depend on the actual values in the degrees of freedom q may be written as $s=f(q)$. This function f is determined by the layout of the position measurement system and will normally be non-linear. However, the function may be linearized around q=0, i.e., around the center of the range:

$$s=f(q)=Mq+d(q)$$

where $M=df/dq|(q=0)$

Consequently the pseudo inverse may be determined to derive a model for q:

$$q=M^{-P}s+e(q)$$

where $M^{-P}$ denotes the pseudo inverse of M and where $e(q)=-M^{-P}d(q)$.

Now, when this model is derived for the position measurement system of FIG. 2, the relation between sensor values of the capacitive sensors 3 and the actual position in the three coplanar degrees of freedom may be written as:

$$Zi=Z+yi*Rx-xi*Ry+dZi(Y) \text{ for } i=1,\ldots,4$$

where Zi is the sensor value of the four capacitive sensors 3 and where Z, Rx, and Ry are the 3 degrees of freedom on which the sensor value depends and where dZi(Y) is a residual value due to unflatness of the electrodes of the capacitive sensors.

This may be written as:

$$\begin{bmatrix} Z1 \\ Z2 \\ Z3 \\ Z4 \end{bmatrix} = \begin{bmatrix} 1 & y1 & -x1 \\ 1 & y2 & -x2 \\ 1 & y3 & -x3 \\ 1 & y4 & -x4 \end{bmatrix} \begin{bmatrix} Z \\ Rx \\ Ry \end{bmatrix} + \begin{bmatrix} dZ1(Y) \\ dZ2(Y) \\ dZ3(Y) \\ dZ4(Y) \end{bmatrix}$$

When now, for instance, it is assumed that y1=y4=0, x4=−x1, x3=−x2, y3=−y2, a model for Z, Rx and Ry may be derived by determining the pseudo inverse:

$$\begin{bmatrix} Z \\ Rx \\ Ry \end{bmatrix} = \begin{bmatrix} 1/4 & 1/4 & 1/4 & 1/4 \\ -x2/(2y2x1) & 1/(2y2) & -1/(2y2) & x2/(2y2x1) \\ -1/(2x1) & 0 & 0 & 1/(2x1) \end{bmatrix} \begin{bmatrix} Z1 \\ Z2 \\ Z3 \\ Z4 \end{bmatrix} + \dots$$

In this model all four capacitive sensors with equal weight determine the Z measurement. Therewith the noise of the signals of the respective sensors is repressed, since the noise levels are averaged. This may result in a noise level reduced with a factor 1/sqrt(4)=½.

The redundancy of capacitive sensors 3 in the position measurement system 1 may also be used for consistency calibration. Consistency in this case means that the four sensors span one plane (this may for instance be compared to a table having four legs; the ends of the four legs have to end in the same plane to obtain a consistent support by all four legs). The constraints on a calibration may be that before and after calibration Z=Rx=Ry=0 corresponds to the same physical position, since there is no point in changing these values with a sensor consistency calibration. Therefore, there are 3 constraints, i.e., requirements on Z, Rx, and Ry.

The model for each capacitive sensor consists of a gain and an offset, i.e., two parameters per sensor. In case of three sensors there are six parameters. As there are three constraints, three independent parameters can not be calibrated. However, in the case of four sensors there are eight parameters. Because also in this case there are three constraints this results in five independent parameters. By placing the patterning device 2 in different combinations of Z, Rx, Ry setpoints and reading all four capacitive sensors 3, four out of the five independent parameters can be determined/calibrated.

Since with the consistency calibration it is possible to determine four of five parameters, there is only one uncalibrated parameter. This parameter is for instance the average gain. The reason that this cannot be calibrated is that there is no absolute external reference. Thus, because of the redundancy in the position measurement system the consistency calibration is partly absolute.

Since the consistency calibration only uses position measurements, i.e., no tools or measurements with other sensors are used, it is possible to perform this calibration very fast. Even in-line, i.e., during production, calibration is possible. As a consequence, changes in the parameters (for whatever reason) can be detected very quickly. By adapting the parameters or by stopping the production yield loss can be circumvented. Furthermore, un-safe situations, such as strange or unexpected movements or collisions of the respective movable object can be prevented.

Thus by weighing, in particular averaging the signals of the different sensors of a redundant position measurement system, the noise of the different sensors may be repressed to a level which is substantially lower than the noise level in the known lithographic apparatus. In the calculation, the noise levels of the sensors may be represented by the standard deviation of the signal. The choice of a function which relates the signals of the different sensors to the actual position in the degrees of freedom can be used to optimize the noise level during position measurement in the respective degrees of freedom.

Furthermore, the consistency calibration, i.e., the calibration of the (redundant) sensors of the position measurement system according to embodiments of the present invention may be used as a (partly) absolute calibration. This follows from the fact that after consistency calibration you have three unknown parameters in the case of three sensors, but only one unknown parameter in the case of four sensors. As such calibration is relatively fast, the consistency can very well be used for in-line detection of changes and, consequently, it is very useful for preventing yield loss and/or unsafe situations.

The position range can be extended by placing extra sensors and by implementing a model which depends on the sensors that "see" the chuck, i.e., take over from sensors when moving the stage. Also, further sensors may be implemented in the position measurement system to obtain further redundancy and therewith linked benefits as described above. It is thereby remarked that after the consistency calibration it does, in principle, not matter anymore which set of three sensors (or all four sensors) is used for measuring the three degrees of freedom.

Hereinabove, an embodiment of the invention was described in relation to the position measurement system 1, as shown in FIG. 2. As will be clear to the man skilled in the art, similar models and corresponding results may be derived for other redundant position measurement systems, such as an interferometer system having eight sensors to measure the position of a substrate table in six degrees of freedom or a 9 spot level sensor for measuring the Z and Ry degrees of freedom of the plane of a substrate. The use of the above described first embodiment of the invention in such other redundant position measurement systems is deemed to fall within the scope of the present invention.

In an alternative embodiment of the first embodiment of the invention, the beam length of the sensor signal is taken into account. In certain embodiments of a position measurement system, the beam lengths of the different sensors (i.e., the distance between the movable object of which the position is measured and the sensor) may significantly change during use. As the performance of such interferometers depends on the beam length, the position of the substrate table with respect to the sensor may be representative of the noise level of the respective interferometer. Such different noise levels may be weighed in order to optimize the position measurement of the movable object.

For instance, in a position measurement system including two x-interferometers and two y-interferometers configured to measure the x-position and y-position and rotation about the z-axis (Rz) of a substrate table which moves in the x-direction and y-direction, the beam length of the different interferometers may substantially change during movement of the substrate table. To take the position of the substrate table into account, the sensor output s as function of the substrate table position can generally be written as:

$s=f(q)$, wherein σ (s, q) takes the position of the substrate table into account. This function can also be written as:

$s=Aq-e(q)$ whereby the function is split in a linear and a non-linear function. Rewriting this function and multiplying with a matrix B gives:

$$BA\,q = Bs + Be(q)$$

To derive a model for q it is required that $$BA = I$$

Consequently:

$$BA\,q = B\,s + Be(q) \quad [1]$$

It is remarked that for $B=A^{-p}$, i.e. the pseudo inverse of A, the requirement B A =I is met. However, in the case of more rows than columns there is some extra freedom in choosing B when defining that:

$$B = A^{-p} + W$$

and substituting this definition in the requirement, the following requirement is obtained:

$$(A^{-p} + W)A = I$$

$$A^{-p}A + WA = I$$

Because $A^{-p}A = I$ (definition of pseudo inverse), the following equality should hold:

$$WA = 0$$

or rewritten:

$$A^T W^T = 0$$

In mathematical terminology, matrix $W^T$ is in the null-space of matrix $A^T$. Or in other words, each row of W (column of $W^T$) is a linear combination of the vectors that span the null-space of $A^T$.

Now, when the sensor noise depending on the sensor value (e.g., beam length) and/or on the substrate table position is defined as σ (s, q), it can be derived from equation [1] that the noise on the position measurement q is B σ (s, q).

In the choice of B and W, there are per degree of freedom a few weight factors for minimizing the noise of the corresponding degree of freedom. It is noted that in practice in particular matrix B ($=A^{-p}+W$) is considered for this purpose. Then, in fact B σ(s,q) is in a certain sense minimized.

Above optimization can be performed for different points in the working range, i.e., for different combinations of beam lengths. From the different weights calculated for all points, functions can be derived for the weights as function of the degrees of freedom of beam lengths.

For instance, if there are n sensors for measuring m degrees of freedom, matrix A is n×m, with n≧m. Consequently, matrix B is m×n, i.e., m*n values that can be chosen. However, matrix B*A is m×m and should equal I, i.e., m*m requirements. So, there are m*(n−m) (=m*n−m*m) variables that can freely be chosen for optimal noise repression. The same analysis can be made for W A=0.

With the above described model the position of the substrate table can thus be taken into account in optimizing the position measurement of the substrate table.

Figure 3:
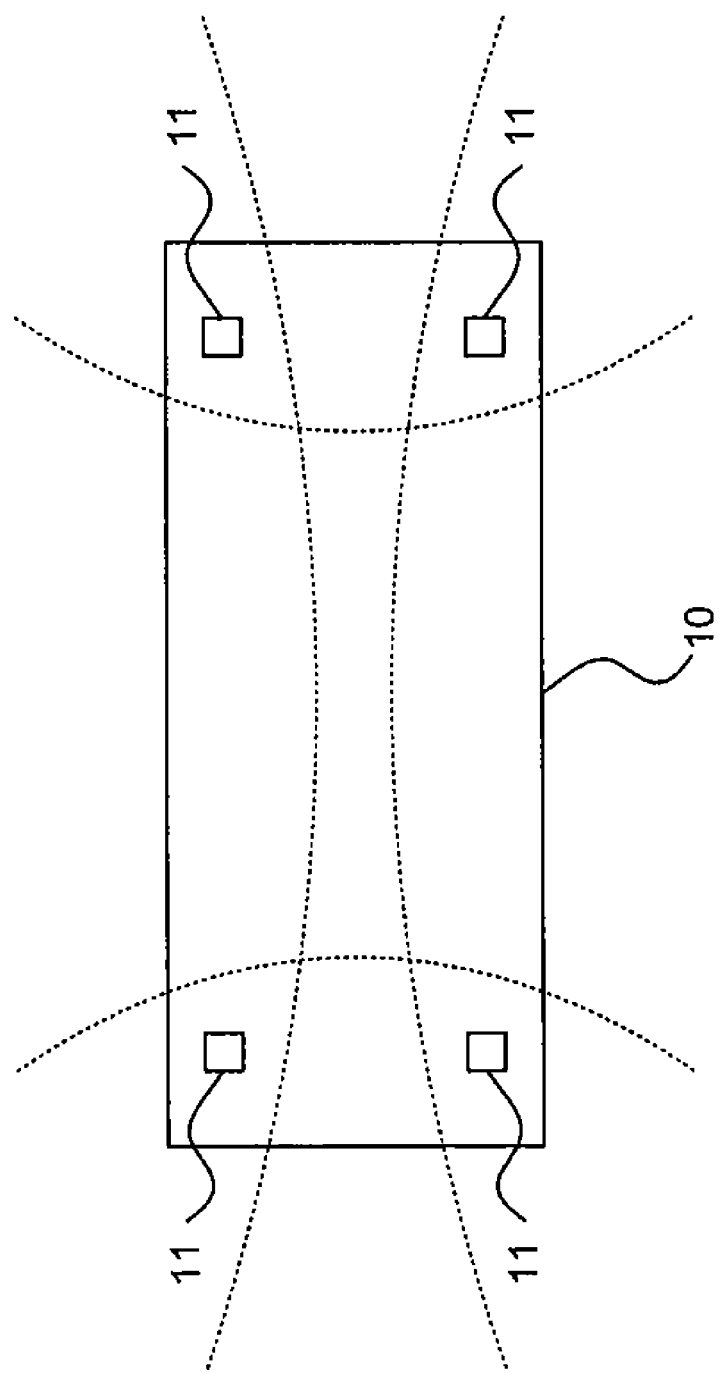
FIG. 3 depicts a patterning device layout according to an embodiment of the invention.

FIG. 3 shows a patterning device layout 10 having a mark 11 in each corner. With this reticle layout, it is possible to perform a method according to a second embodiment of the present invention as will be explained hereinafter. The method includes a calibration step for mapping the substrate surface of a substrate, for instance in six degrees of freedom. For such mapping a reticle layout having a mark is projected on the surface of the substrate. The projection of the mark on the substrate surface is read by sensors so that a mapping of the substrate surface (for example in six degrees of freedom) can be made.

In the known lithographic apparatus, all exposures, i.e., projections of the patterning device layout, are completely on the substrate surface. This means that the calibrated range of the grid is maximally the diameter of the substrate minus the size of the projected image. As a result the grid close to the x and y extremes of the substrate can not be calibrated, which may result in image errors close to the edges of the substrate.

According a second embodiment of the invention, it is proposed that a patterning device layout is used which includes two or more marks, and that the patterning device layout is also projected partly outside the substrate surface so that the calibrated range of the grid is enlarged.

Figure 4:
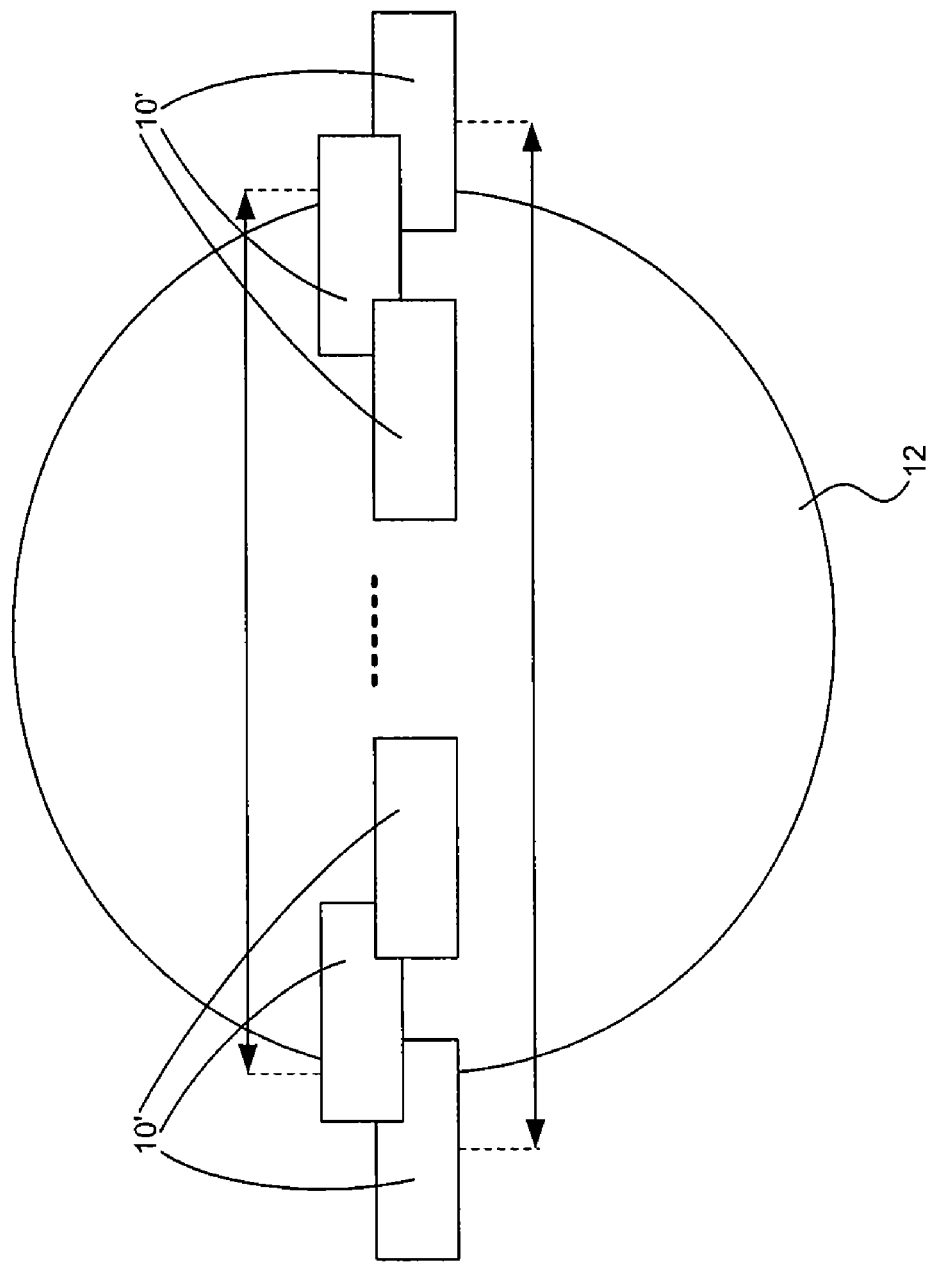
FIG. 4 depicts projections of the patterning device layout of FIG. 3 on a substrate surface.

In FIG. 4, the different subsequent projections 10' of the patterning device layout 10 of FIG. 3 on a substrate surface 12 are shown. These projections of the marks 1 (not shown in FIG. 4) are used to measure the grid of the substrate surface to calibrate this surface. As the patterning device layout 10 has a mark in each corner, the patterning device layout 10 has always two marks projected on the substrate surface when half of the patterning device layout is projected outside the substrate surface. This is independent of the side of the substrate surface where the patterning device layout is projected partly outside the substrate surface, as marks are provided in each corner of the patterning device layout. As a result, these two marks projected on the substrate surface can be used for the calibration. In this way the calibrated range of the substrate surface is enlarged. As a consequence, by using multi-mark patterning device layouts which are projected partly outside the substrate surface for calibrating the edges of the substrate surface, the overlay and focus of the outer dies (the dies near the edges of the substrate) are improved.

Any suitable marks, such as XPA, SPM and orthobox marks, may be used as marks on the patterning device layout. For instance, normal marks and orthobox marks can be used for X, Y and Rz maps, while Z, Rx and Ry can be calibrated using so-called focal calibration. Also, other map types such as so-called XTY and XRZ maps can be calibrated. Furthermore, it is possible to use more than four marks to improve the accuracy of the calibration.

The method according to a second embodiment of the invention may be used for lithographic apparatus having a single substrate table or having two substrate tables, and for separate as well as combined measure and expose areas.

Figure 5:
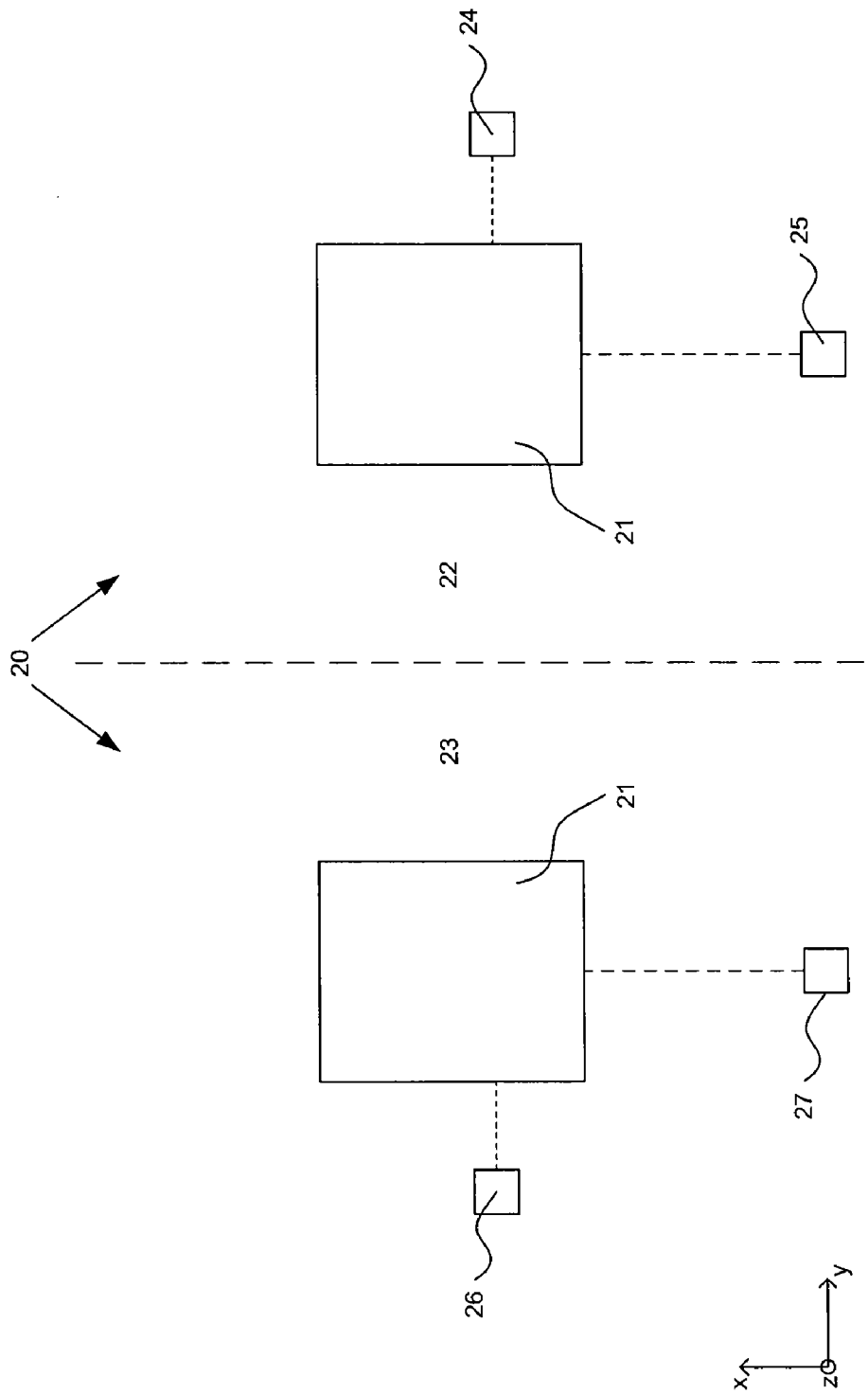
FIG. 5 depicts a conventional position measurement system.

FIG. 5 shows a conventional position measurement system 20 configured to measure the position of a substrate table 21. The position measurement system 20 is arranged in both a measure area 22 wherein a surface of a substrate supported on the substrate table is measured and in an exposure area 23 where images are projected on the surface of the substrate. In the y-direction the measure area 22 and the exposure area 23 are arranged adjacent to each other to make the exchange of substrate tables 21 between the areas 22 and 23 possible. By adjacent is meant that the measure area 22 and exposure area 23 are arranged next to each other; the areas may be overlapping or there may be a certain space between the two areas not directly belonging to one of these areas 22 and 23.

In the measure area 22 and the exposure area 23, interferometers 24, 25, 26 and 27 are provided to measure the position of the substrate table in the respective area. It is desirable to have highly accurate measurements of the position in both the measure area and the expose area in order to obtain a required level of overlay and focus.

In the known lithographic apparatus the interferometers 24 and 26 are configured to measure the y-position, the interferometers 25 and 27 are configured to measure both the x-position.

In principle, the positions of the substrate table 21 in the measure area 22 and the exposure area 23 will, at least partly, correspond. Therefore, for a certain position of the substrate table 21, for instance relatively to the left in the drawing, the beam length of the interferometer 24 in the measure area 22 will be long, while the beam length of the interferometer 26 in the corresponding position of the substrate table 21 in the exposure area will be short. However, for corresponding positions of the substrate table 21 in measure area 22 and exposure area 23 the beam length of the interferometers 25 and 27 will be the same (for instance for both areas long).

Figure 6:
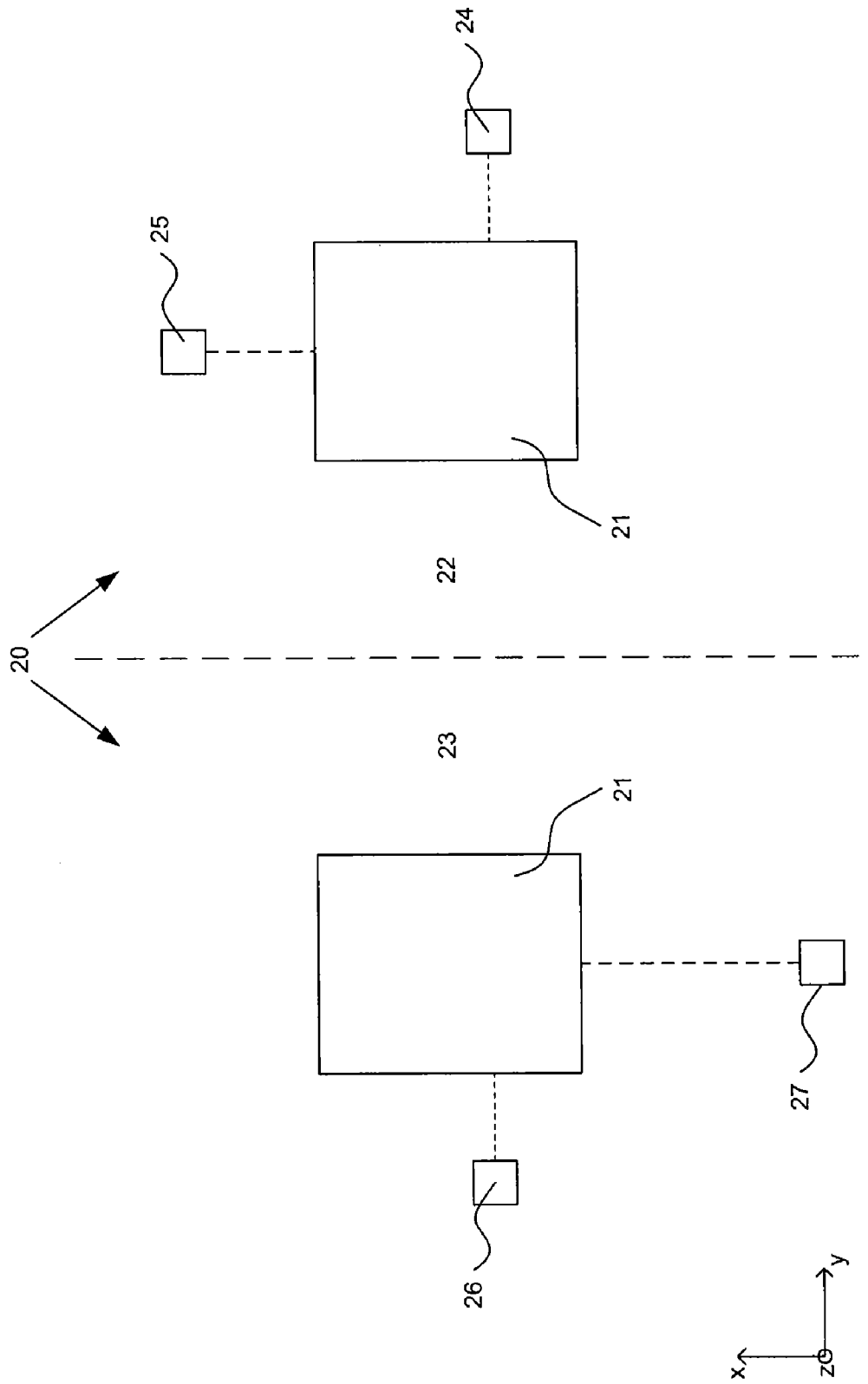
FIG. 6 depicts a position measurement system according to an embodiment of the invention.

Since at the accuracy levels of the present application the performance of the interferometers depends on the beam length, i.e., performance becomes worse with increasing beam length, and the overlay and focus accuracy depends on the combination of the position measurement in the measure area 22 and the exposure area 23, a third embodiment of the invention proposes to arrange the interferometer 25 at the opposed side of the exposure area so that in the x-direction the interferometers for x-position measurement are located on opposite sides of the substrate table 21. This arrangement according to this embodiment of the invention is shown in FIG. 6. As a result, the measurement in the x-position will no longer have a combination of a long beam length in the measure area 22 and a long beam length in the expose area 23, but a long beam length in one of the areas 22, 23 will be combined with a short beam length in the other of the areas 22, 23.

As, as explained above, the combination of measurements is representative of the overlay and focus performance, there is no longer a range of positions in which the position measurement is relatively inadequate due to the relatively long beam length of the interferometers in both areas 22 and 23. On the contrary, a relatively inadequate measurement in the measure area 22 (long beam length) is compensated by a relatively good measurement in the exposure area 23 (short beam length), and vice versa.

In an alternative embodiment it is also possible to arrange the interferometer 27 on the opposite side of the measure area 22 and maintain the arrangement of FIG. 5 in the exposure area 23.

With the interferometer arrangement as proposed according to this third embodiment of the present invention, the accuracy in overlay and focus is improved while no additional sensors or such have to be provided. Furthermore, the existing conditioning device, such as air showers, in the known lithographic apparatus may be maintained in the lithographic without relocation, as in principle the location of the interferometers is unchanged. However minor modifications with respect to routing of optical fibers and/or electronics may be desirable to make the swap of the interferometers possible.

In the arrangement according to FIGS. 5 and 6 only interferometers for measuring the x-position and y-position are shown. In practice, the position measurement system may include further sensors to measure the position of the substrate table in the same or other degrees of freedom. The third embodiment of the invention as explained with respect to the x-position interferometers may also be used for any other sensors in the position measurement system. These sensors may be interferometers but also any other type of suitable sensors. In the case of redundant sensors the weighing of sensor signals according to the first embodiment of the invention may be applied.

Furthermore, the same arrangement according to the third embodiment of the invention may be used in any other position measurement system where use is made of sensors of which the performance becomes worse at longer measure distances. Such system including the proposed arrangement are deemed to fall within the scope of the present invention. Such systems do not have to be limited to substrate tables, but may be used for the position measurement of any movable object, wherein such arrangement is useful, such as for instance the position measurement of a patterning device support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads,.etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A device manufacturing method comprising:
projecting a patterned beam of radiation onto a substrate;
determining a position of a movable object in a plurality of degrees of freedom using a plurality of sensors, said plurality of sensors being at least one more in number than said plurality of degrees of freedom being measured, wherein said position of said movable object in said plurality of degrees of freedom is determined using signals of each of said sensors; and
weighing said signals of said sensors by averaging said signals based on a difference between noise levels of each of said sensors, such that an overall noise level of said sensors is optimally repressed.

2. The method of claim 1, wherein said noise levels are represented by the standard deviation of said signal of each of said sensors.

3. The method of claim 1, wherein the position of said movable object with respect to the sensors is taken into account to determine said difference between noise levels.

4. The method of claim 1, further comprising selecting a function which relates said position of said movable object in said plurality of degrees of freedom to the signals of each of the sensors to optimize a standard deviation of said position of said movable object in said number of degrees of freedom.

5. A lithographic apparatus comprising:
an illumination system configured to condition a radiation beam;
a patterning device configured to pattern the radiation beam with a pattern in its cross-section to form a patterned radiation beam;
a substrate table constructed and arranged to hold a substrate;
a projection system configured to project the patterned radiation beam onto a target portion of the substrate;
a position measuring system configured to measure a position of a movable object in a plurality of degrees of freedom, said position measuring system comprising a plurality of sensors, said plurality of sensors being at least one more in number than said plurality of degrees of freedom being measured; and
a calculation device configured to (a) calculate the position of said movable object in said plurality of degrees of freedom based on signals of each of said sensors, and (b) weigh said signals of said sensors by averaging said signals based on a difference between noise levels of each of said sensors, such that an overall noise level of said sensors is optimally repressed.

6. The lithographic apparatus of claim 5, wherein said calculation device is configured to use a standard deviation of said signals of each of said sensors to represent said noise levels.

7. The lithographic apparatus of claim 5, wherein said calculation device is configured to weigh the signals of said sensors based on a beam length of each of the sensors.

8. The lithographic apparatus of claim 5, wherein said calculation device is configured to optimize the standard deviation of said position of said movable object in said plurality of degrees of freedom based on a function which relates said position of said movable object in said plurality of degrees of freedom to the signals of each of the sensors.

* * * * *